US012431914B2

(12) United States Patent
Chusattayanond (10) Patent No.: US 12,431,914 B2
(45) Date of Patent: Sep. 30, 2025

(54) SIGMA-DELTA MODULATOR BASED ANALOG-TO-DIGITAL CONVERTER AND DITHERING METHOD THEREOF

(71) Applicant: Silicon Craft Technology Public Company Limited (SICT), Bangkok (TH)

(72) Inventor: Oon Chusattayanond, Bangkok (TH)

(73) Assignee: Silicon Craft Technology Public Company Limited (SICT), Bangkok (TH)

( * ) Notice: Subject to any disclaimer, the term of this patent is extended or adjusted under 35 U.S.C. 154(b) by 99 days.

(21) Appl. No.: 18/287,987

(22) PCT Filed: Jun. 30, 2021

(86) PCT No.: PCT/IB2021/055838
§ 371 (c)(1),
(2) Date: Oct. 23, 2023

(87) PCT Pub. No.: WO2023/275594
PCT Pub. Date: Jan. 5, 2023

(65) Prior Publication Data
US 2024/0297663 A1   Sep. 5, 2024

(51) Int. Cl.
*H03M 3/00* (2006.01)

(52) U.S. Cl.
CPC ............. *H03M 3/328* (2013.01); *H03M 3/39* (2013.01)

(58) Field of Classification Search
CPC ........ H03M 3/328; H03M 3/39; H03M 3/424; H03M 3/43; H03M 3/458; H03M 3/33; H03M 3/30; H03M 3/50; H03M 7/3004
See application file for complete search history.

(56) References Cited

U.S. PATENT DOCUMENTS

| | | | |
|---|---|---|---|
| 8,217,816 B2 * | 7/2012 | Das | H03M 3/434 341/139 |
| 9,602,126 B2 * | 3/2017 | Schinkel | H03M 3/464 |
| 10,355,709 B1 * | 7/2019 | Sharma | H03M 3/464 |
| 11,121,718 B1 * | 9/2021 | Maurino | H03M 1/0626 |
| 2003/0112163 A1 | 6/2003 | Ercan et al. | |
| 2006/0170576 A1 | 8/2006 | Weibiao et al. | |
| 2008/0297389 A1 | 12/2008 | Ignjatovic | |
| 2015/0341046 A1 | 11/2015 | Schinkel et al. | |

OTHER PUBLICATIONS

International Search Report and Written Opinion issued in PCT/IB2021/055838 dated Sep. 29, 2021.

* cited by examiner

*Primary Examiner* — Toan N Pham
(74) *Attorney, Agent, or Firm* — Troutman Pepper Locke LLP (57) ABSTRACT

The disclosed invention is a sigma-delta modulator based ADC and a dithering method thereof. An analog dither circuit of an input stage in a quantizer, which is configured to perform dithering, receives an integrator output signal from an output of an integrator and a plurality of digital dither signals from digital dither generator, and employs these signals to produce multi-level analog dither signals via the operation of a plurality of transistors as switches coupled with a plurality of resistors coupled in series. The multi-level analog dither signals can prevent, reduce, or eliminate limit cycle in the sigma-delta modulator based ADC. Furthermore, disclosed invention does not require fixed load capacitance, resulting in no extra power consumption and solve the problem as the kickback noise variation.

30 Claims, 5 Drawing Sheets

SIGMA-DELTA MODULATOR BASED ANALOG-TO-DIGITAL CONVERTER AND DITHERING METHOD THEREOF

This application is a U.S. national stage application of International Application No. PCT/IB2021/055838, filed on Jun. 30, 2021, the entire contents of which application is hereby incorporated by reference in its entirety.

TECHNICAL FIELD OF THE INVENTION

This invention relates to technical field of analog-to-digital converter (ADC) and, in particular, to a sigma-delta modulator based analog-to-digital converter and a dithering method thereof.

BACKGROUND OF THE INVENTION

Sigma-delta modulator (SDM) is one of critical parts in an oversampling analog-to-digital converters (ADCs) which is a type of ADC that requires multiple samplings for the complete conversion process. Sigma-delta modulator, whichever order it might be, by its nature, can introduce limit cycle at multiple input levels. The limit cycle produces repeating output pattern from the integrator as well as at the quantizer output. The output pattern, if it has frequencies components that fall inside a passband of an ADC, the output signal of the ADC can appear to be unstable even if the input signal is stable. This is called tones. Furthermore, a non-desirable limit cycles which produces tones, additionally causes undesired distortions, errors, or variations in the output signal as taught by, for example, Schreier, R., & Temes, G. C. (2004). *Understanding Delta-Sigma Data Converters*. The limit cycles can be reduced or eliminated by the process of dithering.

Figure 1:
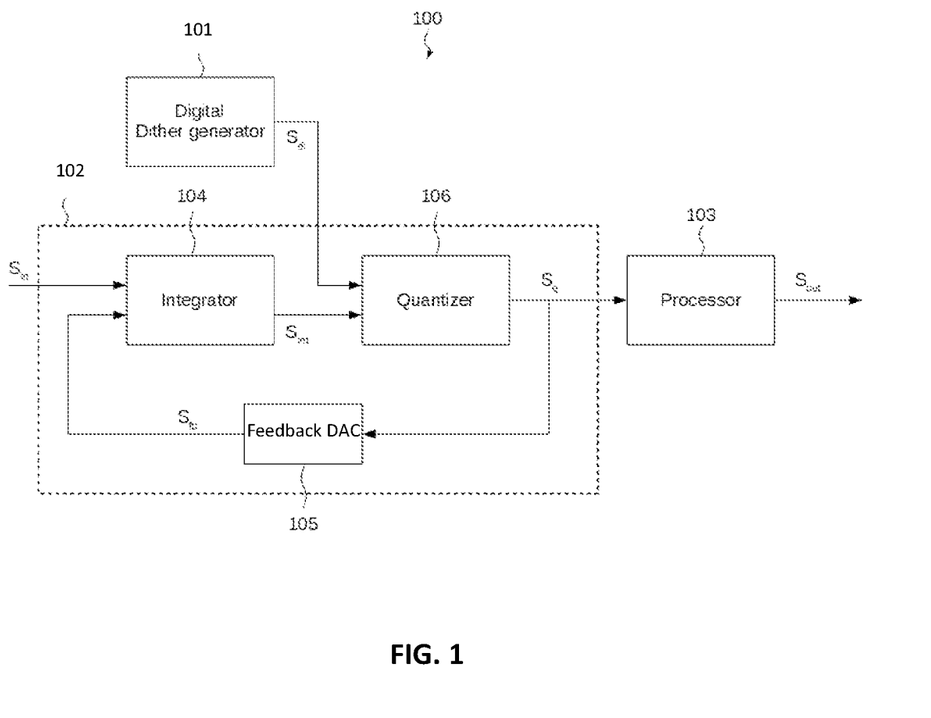
FIG. 1 is an example block diagram of a sigma-delta modulator based ADC having a digital dither generator according to the invention.

As well known by the person skilled in the art, dithering has been taught as adding a uniform random signal, called dither noise, which is the output signal of digital dither generator $S_{di}$, into the sigma-delta modulator loop at the input of the quantizer as shown in FIG. 1. The output pattern from limit cycles might be destroyed by the dither noise. The dither noise, as taught and as mathematically modelled, is also suggested to have a plurality of amplitudes which must be uniformly distributed and zero average over the ADC's operating period. It can be produced by, for example, multi-bit pseudo-random generator or true-random generator. One example of the analog apparatus of dither noise injection, as disclosed in this invention and some prior arts, can be to change the quantizer's input-referred offset level randomly.

Referring to the U.S. Pat. No. 9,356,617 B2, the disclosed quantizer can be configured to receive a plurality of digital dither signals by a plurality of transistors in series with a plurality of input transistors configured to receive a signal from the integrator. This introduces a set of drawbacks i.e., the plurality of input transistors introduces a fixed load capacitance to the integrator, resulting in more power consumption from the integrator circuit. While the digital dither signal changes value, the kickback noise from the quantizer will be subsequently changed, depending on the digital dither signal value at a certain moment.

Referring to the U.S. Pat. No. 6,473,019 B1, the disclosed quantizer has an extra apparatus coupled directly to the output terminal of the input stage of the quantizer. The apparatus functions as a plurality of current sources or sinks, where the apparatus can be configured to receive a plurality of digital dither signals through the use of a current digital-to-analog converter. This requires both extra power and peripheral circuits to operate.

According to problems in the prior arts, the present invention aims to solve such problems including load capacitance, kickback noise variation with the dither noise and extra power consumption by integrating the disclosed apparatus of the present invention with the input stage of the quantizer while maintaining the input transistor's function. The input stage with the disclosed apparatus can be coupled to many suitable subsequence stages, as one example, the apparatus disclosed in U.S. Pat. No. 6,473,019 B1. The features of the present invention will be described in the following detailed description and drawings which set illustrative embodiments in which the principles of the invention are utilized.

SUMMARY OF THE INVENTION

The present invention relates to a sigma-delta modulator based analog-to-digital converter (ADC) (100), comprising:
 a digital dither generator (101) configured to provide a plurality of digital dither signals $S_{di}$.
The digital dither generator (101) comprises a dither pattern generator (601) and a binary decoder (602);
 a sigma-delta modulator loop (102) configured to receive an input analog signal $S_{in}$ and the plurality of digital dither signals $S_{di}$, and to provide a quantizer output signal $S_q$; and
 a processor (103) configured to provide a digital representation of the input analog signal $S_{in}$;
 where the sigma-delta modulator loop (102) comprises:
  an integrator (104) configured to provide an integrator output signal $S_{int}$;
  a feedback digital to analog converter (DAC) (105) configured to receive the quantizer output signal $S_q$ and to produce a feedback signal $S_{fb}$; and
  a quantizer (106) configured to receive the integrator output signal $S_{int}$ and the plurality of digital dither signals $S_{di}$ and to output the quantizer output signal $S_q$,
  where the quantizer 106 comprises:
   an input stage (201) configured to receive the integrator output signal $S_{int}$ and the plurality of digital dither signals $S_{di}$ and to provide an output signal $S_{cmp}$; and
   a gain stage (202) configured to receive the output signal $S_{cmp}$ and to output the quantizer output signal $S_q$,
  where input stage (201) comprises:
   a current source (301);
   a pair of input transistors (302) configured to produce first and second output current signals $S_{curr\_a}$, $S_{curr\_b}$ in relation to the integrator output signal $S_{int}$ and a threshold signal $S_{threshold}$;
   a load network (303) configured to convert the first and second output current signals $S_{curr\_a}$, $S_{curr\_b}$ into the output signals $S_{cmp\_a}$, $S_{cmp\_b}$ of the input stage (201); and
   an analog dither circuit (304)
   characterized in that
    the analog dither circuit (304) coupled in series between the current source (301) and the pair of input transistors (302) and configured to receive the plurality of digital dither signals $S_{di}$ and to divide a bias current from the current source (301) to each transistor of the pair of input transistors (302)

According to the present invention, the analog dither circuit (304) comprises
- a plurality of resistors (401) coupled in series and configured to provide resistance; and
- a plurality of transistors as switches (402) configured to function as switches.

According to the present invention, the plurality of resistors (401) provide resistance between a first source terminal $S_{source\_a}$ of the pair of input transistors (302) to an output $S_{current}$ of the current source (301) and a second source terminal $S_{source\_b}$ of the pair of input transistors (302) to the output $S_{current}$ of the current source (301).

According to the present invention, the plurality of resistors (401) providing resistance depending on current division ratio of the divided current.

According to the present invention, the transistors of the plurality of transistors as switches (402) are coupled with terminals of resistors of the plurality of resistors (401) at drain terminals.

According to the present invention, the plurality of transistors as switches (402) are coupled with the plurality of digital dither signals $S_{di}$ at control terminals (405).

According to the present invention, the plurality of transistors as switches (402) are coupled with the output $S_{current}$ of the current source (301) at source terminals (406).

According to the present invention, each transistor of the plurality of transistors as switches (402) is configured to provide a current path from the output $S_{current}$ of the current source (301) to one of the terminals of the plurality of resistors (401) when one of the transistors of the plurality of transistors as switches (402) is turned on.

According to the present invention, the transistor of the plurality of transistors as switches (402) providing the current path is controlled by the plurality of digital dither signals $S_{di}$.

According to the present invention, each transistor of the plurality of transistors as switches (402) is configured to receive each signal of the plurality of digital dither signals $S_{di}$.

According to the present invention, the plurality of digital dither signals $S_{di}$ is generated from the binary decoder (602) and then received by the analog dither circuit (304).

According to the present invention, the binary decoder (602) is N-to-M binary decoder (701) configured to decode a plurality of binary representation of a dither pattern $S_{di\_bin}$ and to produce the plurality of digital dither signal $S_{di}$,
wherein a number of decoded output bits (M) are correlated to a number of a binary coded input (N), calculated as $M=2^N$.

According to the present invention, the analog dither circuit (304), coupled in series between the first and second source terminals $S_{source\_a}$, $S_{source\_b}$ of the pair of input transistors (302) and to the output $S_{current}$ of the current source (301).

According to the present invention, left and right terminals of the plurality of resistors (403, 404) are coupled to the first and second source terminals $S_{source\_a}$, $S_{source\_b}$ respectively of the pair of input transistors (302).

According to the present invention, a number of the plurality of transistors as switches (402) are the same as a number of the plurality of digital dither signals $S_{di}$; and a number of the plurality of resistors (401) are at least one more than the number of the plurality of transistors as switches (402).

According to the present invention, the plurality of resistors (401) can be replaced by a plurality of transistors, configured to function as resistors, biased in linear region.

According to the present invention, all resistors in the plurality of resistors (401) can be of the same predetermined values.

According to the present invention, each transistor of the plurality of transistors as switches (402) is only coupled with one digital dither signal from the plurality of digital dither signals $S_{di}$.

According to the present invention, the current division ratio of the divided current depends on the plurality of digital dither signals $S_{di}$.

According to the present invention, the plurality of digital dither signals $S_{di}$ control the current division ratio by controlling which transistor, belonging to the plurality of transistors as switches (402), to turn on.

According to the present invention, the current division ratio from the first and second source terminals $S_{source\_a}$, $S_{source\_b}$ of the pair of input transistors (302) affects the first and second output current signals $S_{curr\_a}$, $S_{curr\_b}$.

According to the present invention, the first and second output current signals $S_{curr\_a}$, $S_{curr\_b}$ affects, in proportional values, the first and second output signals $S_{cmp\_a}$, $S_{cmp\_b}$ of the input stage (201).

According to the present invention, only one digital dither signal from the plurality of digital dither signals $S_{di}$ can be of logic HIGH at a given time.

According to the present invention, only one digital dither signal from the plurality of digital dither signals $S_{di}$ to be logic HIGH can control a transistor in the plurality of transistors as switches (402) to turn on.

The present invention also relates to a dithering method of sigma-delta based modulator analog-to-digital converter (ADC), comprising:
- receiving an input analog signal $S_{in}$ and a feedback signal $S_{fb}$ at an integrator (104) to provide an integrator output signal $S_{int}$;
- receiving the integrator output signal $S_{int}$ and a plurality of digital dither signal $S_{di}$ at an input stage (201) of the quantizer (106) and comparing the integrator output signal $S_{int}$ and the plurality of digital dither signals $S_{di}$ against a threshold signal $S_{threshold}$ to produce an output signal $S_{cmp}$ of the input stage (201);
- amplifying the output signal $S_{cmp}$ of the input stage (201) at a gain stage (202) to produce a quantizer output signal $S_q$;
- receiving the quantizer output signal $S_q$ at a processor (103) to produce a plurality of output digital signals $S_{out}$ as a digital representation of the input analog signal $S_{in}$ characterized in that
- receiving the plurality of digital dither signals $S_{di}$ at control terminals (405) of a plurality of transistors as switches (402) to control the plurality of transistors as switches (402) as turning on or off;
- providing current from a current source (301) to first and second source terminals $S_{source\_a}$, $S_{source\_b}$ of a pair of input transistors (302) through the plurality of transistors as switches (402) and the plurality of resistors (401), respectively;
- receiving the integrator output signal $S_{int}$ and the threshold signal $S_{threshold}$ at control terminals (305) of the pair of input transistors (302);
- producing first and second output current signals $S_{curr\_a}$, $S_{curr\_b}$ in relation to the integrator output signal $S_{int}$ and the threshold signal $S_{threshold}$; and converting the first and second output current signals $S_{curr\_a}$, $S_{curr\_b}$ at a load network (303) to the output signals $S_{cmp\_a}$, $S_{cmp\_b}$ of the input stage (201).

According to the present invention, the dithering method of sigma-delta based modulator analog-to-digital converter (ADC), further comprising generating the plurality of digital dither signals $S_{di}$ at a binary decoder (602) of a digital dither generator (101).

According to the present invention, generating the plurality of digital dither signals $S_{di}$ includes generating logic HIGH and LOW of the plurality of digital dither signals $S_{di}$; and propagating the logic HIGH and LOW of the plurality of digital dither signals $S_{di}$ wherein controlling the plurality of transistors as switches (402) to turn on or off.

According to the present invention, controlling the plurality of transistors as switches (402) is turned on if logic HIGH and controlling the plurality of transistors as switches (402) is turned off if logic LOW.

According to the present invention, the dithering method of sigma-delta based modulator analog-to-digital converter (ADC), further comprising providing current path by one of transistors of the plurality of transistors as switches (402) turned on, from an output $S_{current}$ of the current source (301) to one of the terminals of the plurality of resistors (401).

According to the present invention, the dithering method of sigma-delta based modulator analog-to-digital converter (ADC), further comprising dividing current between the first and second source terminals $S_{source\_a}$, $S_{source\_b}$ of the pair of input transistors (302) according to the current division ratio of the divided current, wherein controlled by transistor of the plurality of transistors as switches (402) which is turned on.

The general purpose of this invention is to provide multi-level analog dither signals using the analog dither circuit (304) with the plurality of digital dither signals to prevent, reduce or eliminate limit cycle in a sigma-delta modulator based ADC (100).

Another purpose of this invention is to provide multi-level analog dither signals using the analog dither circuit (304) while an offset effect of the integrator (104) and the quantizer (106) in the sigma-delta modulator based ADC (100) can be reduced or eliminated by configuring the plurality of digital dither signals $S_{di}$ to have a specific average value that can reduce or eliminate the offset effect of the integrator (104) and the quantizer (106) in the sigma-delta modulator based ADC (100).

These purposes are achieved in accordance with the circuit features which have been briefly summarized above and which will be described in further detail with reference to the accompanying drawings.

DETAILED DESCRIPTION

As recognized by the inventors of the U.S. Pat. No. 9,356,617 B2, in order to sufficiently eliminate the effect of limit cycles in sigma-delta modulator based analog-to-digital converter (ADC), a dither signal with multiple levels added to the input of the quantizer is required. A general example of a first-order, sigma-delta modulator based ADC is presented here, however the working principle of this method and apparatus holds true for a higher order of sigma-delta modulator based ADC.

A general example of a sigma-delta modulator based ADC (100) is illustrated in FIG. 1. The sigma-delta modulator based ADC (100) comprises a digital dither generator (101), a sigma-delta modulator loop (102) and a processor (103). A digital dither generator (101) is configured to provide a plurality of digital dither signals $S_{di}$. The sigma-delta modulator loop (102) is configured to receive an input analog signal $S_{in}$ and the plurality of digital dither signals $S_{di}$ of digital dither generator (101) to provide a quantizer output signal $S_q$. The bitstream representation is then processed via the processor (103); for example, a digital filter, to produce a plurality of output digital signals $S_{out}$ as a digital representation of the input analog signal $S_{in}$. The sigma-delta modulator loop (102) comprises an integrator (104), a feedback digital to analog converter (DAC) (105) and a quantizer (106).

The quantizer (106) is coupled to an integrator (104) via an integrator output signal $S_{int}$. The feedback DAC (105) is coupled to the quantizer (106) via the quantizer output signal $S_q$. The integrator (104) is also coupled to the feedback DAC (105) via a feedback signal $S_{fb}$.

The input analog signal $S_{in}$ is received by the integrator (104). The integrator (104), when receiving the input analog signal $S_{in}$ and the feedback signal $S_{fb}$, produces the integrator output signal $S_{int}$ representing an integration of a summation product of the input analog signal $S_{in}$ and the feedback signal $S_{fb}$, to the quantizer (106).

In another embodiment according to this invention, the integrator (104) can produce the integrator output signal $S_{int}$ up to 2 signals.

The quantizer (106) receives the integrator output signal $S_{int}$ from the integrator (104) and receives a plurality of digital dither signals $S_{di}$ from the digital dither generator (101). The quantizer (106) can be a single-bit or a multi-bit quantizer. For example, the quantizer (106) as single-bit quantizes the integrator output signal $S_{int}$ with a particular single threshold in combination with the plurality of digital dither signals $S_{di}$ and outputs the quantizer output signal $S_q$ as a representation of the input analog signal $S_{in}$ and the plurality of digital dither signals $S_{di}$.

In another embodiment, the quantizer (106) as multi-bit quantizes the integrator output signal $S_{int}$ with a plurality of thresholds in combination with the plurality of digital dither signals $S_{di}$ and outputs the quantizer output signal $S_q$ as a representation of the input analog signal $S_{in}$ and the plurality of digital dither signals $S_{di}$.

In some examples, the plurality of digital dither signals $S_{di}$ can be used to alter the single threshold or the plurality of thresholds of the quantizer (106) to produce dithering with analog dither circuit (304).

In some further examples, the plurality of digital dither signals $S_{di}$ is configured to prevent limit cycles from the sigma-delta modulator based ADC (100).

The feedback DAC (105) receives the quantizer output signal $S_q$ to produce the feedback signal $S_{fb}$ as the sigma-delta modulator loop feedback.

In an example of a sigma-delta modulator based ADC (100), the feedback DAC (105) can be configured as a direct feedback path.

In an example, the feedback DAC (105) can be configured as a direct feedback path in the sigma-delta modulator loop (102) with the single-bit quantizer.

Figure 2:
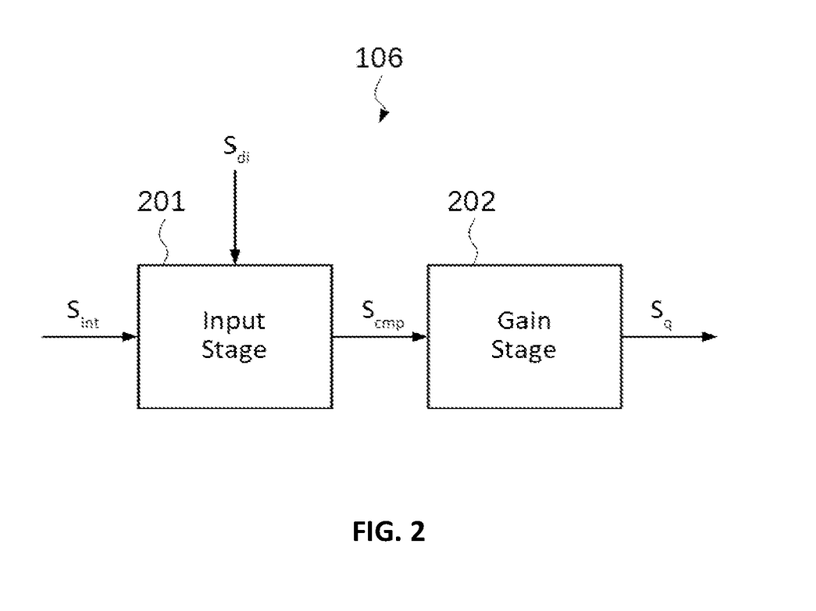
FIG. 2 is an example block diagram of a quantizer of the sigma-delta modulator based ADC according to the invention.

The quantizer (106), as an example according to this invention, comprises an input stage (201) and a gain stage (202) as illustrated in FIG. 2. The input stage (201) can receive two input signals, comprising the integrator output signal $S_{int}$ and the plurality of digital dither signals $S_{di}$ from the digital dither generator (101). The input stage (201) is configured to compare the integrator output signal $S_{int}$ and the plurality of digital dither signals $S_{di}$ against a threshold signal $S_{threshold}$ to produce an output signal $S_{cmp}$ of the input stage (201) to represent the result of the comparison. In an example, the threshold signal $S_{threshold}$ can be generated using a bandgap voltage reference.

In another embodiment, the input stage (201) can be configured to compare the integrator output signal $S_{int}$ and the plurality of digital dither signals $S_{di}$ against a plurality of threshold signals $S_{thredhold}$ to produce a plurality of output signals $S_{cmp}$ of the input stage (201) to represent the result of the comparison. In an example, the plurality of threshold signals $S_{thredhold}$ can be generated using a plurality of resistors coupled in series to form a voltage divider.

The gain stage (202) is configured to receive the output signal $S_{cmp}$ of the input stage (201) and then, as an example, to amplify the output signal $S_{cmp}$ of the input stage (201) to produce the quantizer output signal $S_q$ appropriated to be received by the subsequent stage.

In further example, the gain stage (202) can include a latch to produce the quantizer output signal $S_q$ in a dynamic quantizer.

Figure 3:
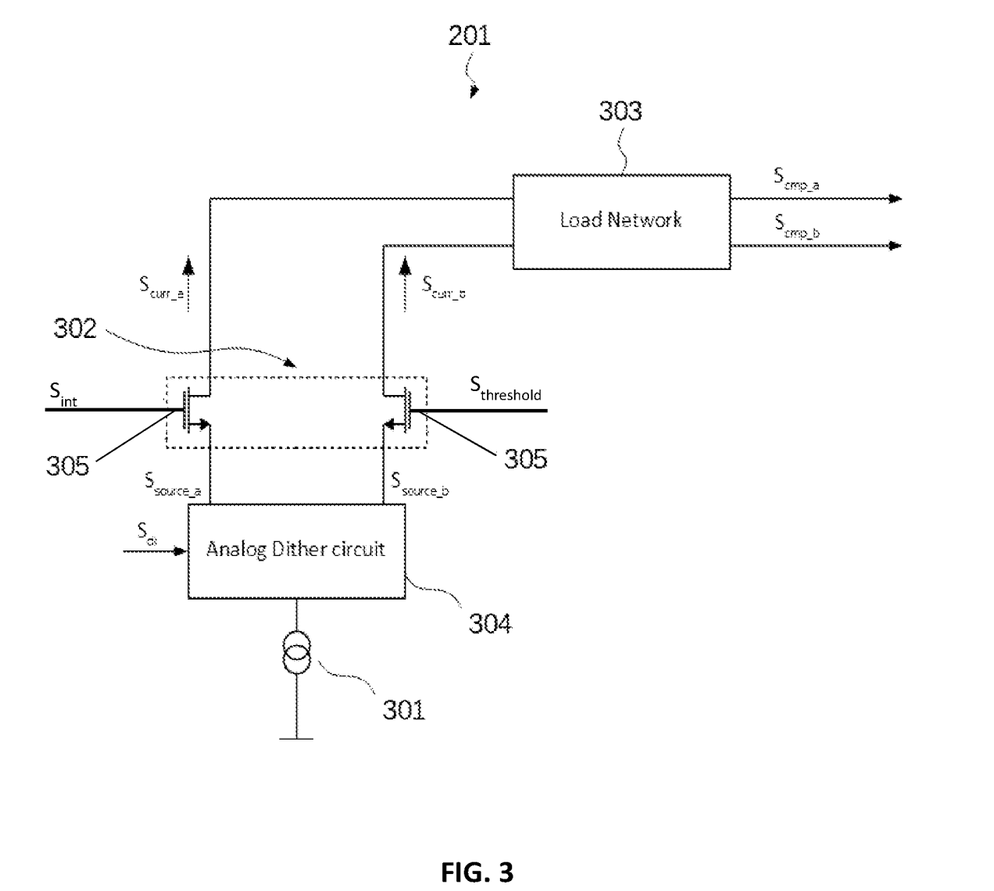
FIG. 3 is an example implementation of an input stage of the quantizer of the sigma-delta modulator based ADC according to the invention.

In an example implementation, the input stage (201) comprises a current source (301), a pair of input transistors (302), a load network (303) and an analog dither circuit (304) as illustrated in FIG. 3. The current source (301) is coupled with the analog dither circuit (304). The analog dither circuit (304) is coupled in series between the current source (301) and the pair of input transistors (302).

The current source (301) has a purpose of maintaining a bias current for the rest of the components in the input stage (201). The pair of input transistors (302) receives the integrator output signal $S_{int}$ and the threshold signal $S_{threshold}$ at control terminals (305) of the pair of input transistors (302). The pair of input transistors (302) then produces first and second output current signals $S_{curr\_a}$, $S_{curr\_b}$ in relation to the integrator output signal $S_{int}$ and the threshold signal $S_{threshold}$ respectively to be received by the subsequent load network (303). For example, the first output current signal $S_{curr\_a}$ can be higher than the second output current signal $S_{curr\_b}$ when the integrator output signal $S_{int}$ is higher than the threshold signal $S_{threshold}$.

In another embodiment, the first output current signal $S_{curr\_a}$ can be lower than the second output current signal $S_{curr\_b}$ when the integrator output signal $S_{int}$ is lower than the threshold signal $S_{threshold}$.

The load network (303) serves as a means to convert the first and second output current signals $S_{curr\_a}$, $S_{curr\_b}$ from the pair of input transistors (302) into the first and second output signals $S_{curr\_a}$, $S_{curr\_b}$ of the input stage (201) to be amplified by the subsequent stages.

As a general example, the load network (303) can be realized by a number of ways, depending on the intended specification and its subsequent stage. In an example embodiment, the load network 303 can be realized as a pair of resistors, where one terminal of the resistors is connected to the power supply and the other is connected to receive the first and second output current signals $S_{curr\_a}$, $S_{curr\_b}$.

In another embodiment, the load network (303) can be realized by a network of transistors, configured to work in saturation region to achieve a high voltage gain.

The analog dither circuit (304), as an example implementation, is coupled in series between the first and second source terminals $S_{source\_a}$, $S_{source\_b}$ of the pair of input transistors (302) and to an output $S_{current}$ of the current source (301) and is coupled to the plurality of digital dither signals $S_{di}$.

Figure 4:
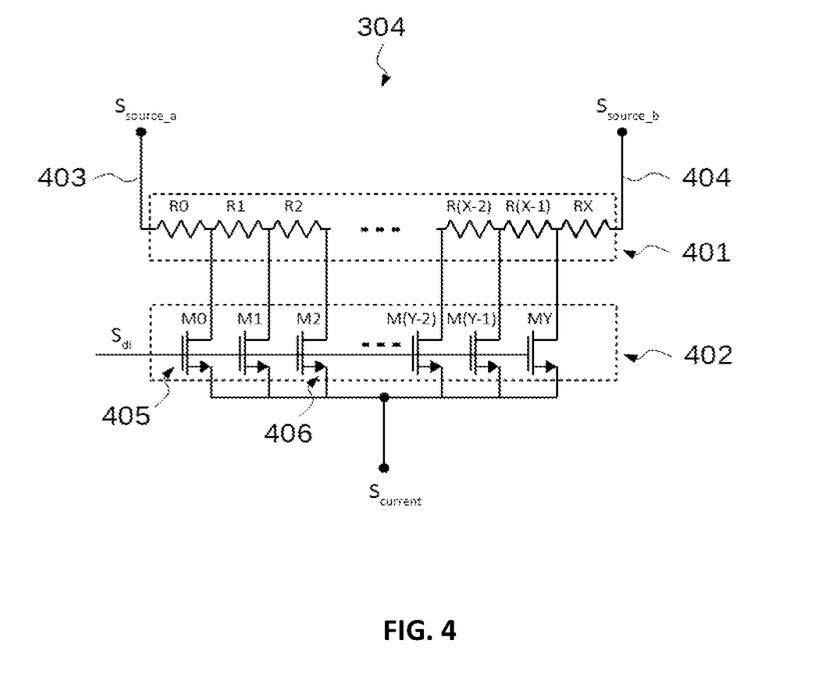
FIG. 4 is an example implementation of an analog dither circuit of the quantizer of the sigma-delta modulator based ADC according to the invention having X dither signal levels.

FIG. 4 illustrates an example embodiment of the analog dither circuit (304) according to this invention. The analog dither circuit (304) comprises a plurality of resistors (401) biased in linear region, coupled in series, and a plurality of transistors as switches (402). The transistors belonging to the plurality of transistors as switches (402) are configured to function as switches. The plurality of resistors (401) can comprise R0 through RX, coupled in series, all of which can be of the same or different predetermined resistance values. The plurality of transistors as switches (402) comprise M0 through MY. The number of the plurality of transistors as switches (402) must be the same as the number bits of the plurality of digital dither signals $S_{di}$. The number of the plurality of resistors (401) must be at least one more than the number of the plurality of transistors as switches (402).

In another embodiment, the plurality of resistors (401) can be replaced by a plurality of transistors biased in linear region.

Figure 5:
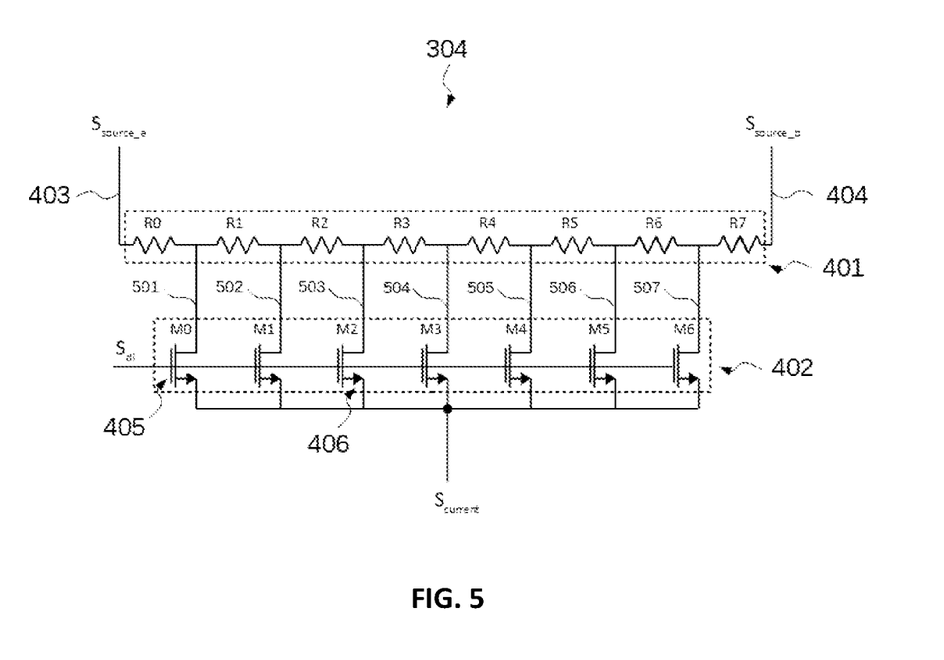
FIG. 5 is an example embodiment of an analog dither circuit of the quantizer of the sigma-delta modulator based ADC according to the invention having seven dither signal levels.

FIG. 5 illustrates an example embodiment of the analog dither circuit (304) which is coupled in series between the first and second source terminals $S_{source\_a}$, $S_{source\_b}$ of the pair of input transistors (302) and to the output $S_{current}$ of the current source (301) and is coupled to the plurality of digital dither signals $S_{di}$. The analog dither circuit (304) comprises the plurality of resistors (401) biased in linear region, coupled in series and the plurality of transistors as switches (402). The plurality of resistors (401) can comprise a first resistor R0 through an eighth resistor R7, all of which can be of the same or different predetermined resistance values. The plurality of transistors as switches (402) can comprise a first transistor M0 through a seventh transistor M6. The left and right terminals (403, 404) of the plurality of resistors (401) are coupled to the first and second source terminals $S_{source\_a}$, $S_{source\_b}$ respectively of the pair of input transistors (302) $S_{source\_a}$, $S_{source\_b}$. Transistors of the plurality of transistors as switches (402) are coupled with terminals of resistors belonging to the plurality of resistors (401) at drain terminals.

The example embodiment according to FIG. 5 is described as follows.

A drain terminal (501) of first transistor M0 is coupled to the terminal between the first resistor R0 and a second resistor R1. A drain terminal (502) of second transistor M1 is coupled to the terminal between the second resistor R1 and a third resistor R2. A drain terminal (503) of third transistor M2 is coupled to the terminal between the third resistor R2 and a fourth resistor R3. A drain terminal (504) of fourth transistor M3 is coupled to the terminal between the fourth resistor R3 and a fifth resistor R4. A drain terminal (505) of fifth transistor M4 is coupled to the terminal between the fifth resistor R4 and a sixth resistor R5. A drain terminal (506) of sixth transistor M5 is coupled to the terminal between the sixth resistor R5 and a seventh resistor R6. And a drain terminal (507) of seventh transistor M6 is coupled to the terminal between the seventh resistor R6 and a eighth resistor R7. The plurality of digital dither signals $S_{di}$ are coupled to the plurality of transistors as switches (402) at control terminals (405) such that each transistor of the plurality of transistors as switches (402) is only, but not limited to, coupled with one digital dither signal from the plurality of digital dither signals $S_{di}$. The plurality of transistors as switches (402) are coupled with the output $S_{current}$ of the current source (301) at source terminals (406).

The analog dither circuit (304) divides the bias current from the current source (301) to each transistor, belonging to the pair of input transistors (302), in which the current division ratio of the divided current depends on the plurality of digital dither signals $S_{di}$. The plurality of digital dither signals $S_{di}$ controls the current division ratio by controlling which transistor, belonging to the plurality of transistors as switches (402), to turn on. When one of the transistors, belonging to the plurality of transistors as switches (402), is turned on, the transistor provides a current path from the output $S_{current}$ of the current source (301) to one of the terminals of the plurality of resistors (401).

In an example of the operation of the analog dither circuit (304) referred to FIG. 5, the plurality of digital dither signals $S_{di}$ controls the fourth transistor M3 to turn on while the others, first transistor M0 through third transistor M2 and fifth transistor M4 through seventh transistor M6 are turned off. In this example, a current path between the output $S_{current}$ of the current source (301) and the terminal between the fourth resistor R3 and the fifth resistor R4 is provided by the fourth transistor M3. The current between the first and second source terminals $S_{source\_a}$, $S_{source\_b}$ of the pair of input transistors (302) is divided equally because the resistance between the first source terminal $S_{source\_a}$ of the pair of input transistors (302) to the output $S_{current}$ of the current source (301) is equal to the resistance between the second source terminal $S_{source\_b}$ of the pair of input transistors (302) and to the output $S_{current}$ of the current source (301), this assumes that the voltage at the first and second source terminals $S_{source\_a}$, $S_{source\_b}$ of the pair of input transistors (302) are the same.

In further example of the operation of the analog dither circuit (304) referred to FIG. 5, the plurality of digital dither signals $S_{di}$ controls the second transistor M1 to turn on while the others, first transistor M0 and third transistor M2 through seventh transistor M6 are turned off. In this example, a current path between the output $S_{current}$ of the current source (301) and the terminal between the second resistor R1 and the third resistor R2 is provided by the second transistor M1. The current between the first and second source terminals $S_{source\_a}$, $S_{source\_b}$ of the pair of input transistors (302) is divided with a ratio of 3:1 because the resistance between the first source terminal $S_{source\_a}$ of the pair of input transistors (302) to output $S_{current}$ of the current source (301) is three times less than the resistance between the second source terminal $S_{source\_b}$ of the pair of input transistors (302) to output $S_{current}$ of the current source (301), this assumes that the voltage at the first and second source terminals $S_{source\_a}$, $S_{source\_b}$ of the pair of input transistors (302) are the same. Such difference in current values between the first and second source terminals $S_{source\_a}$, $S_{source\_b}$ of the pair of input transistors (302), controlled by the plurality of digital dither signals $S_{di}$, also affects, regarding their values, the first and second output current signals $S_{curr\_a}$, $S_{curr\_B}$, according to the current division ratio from the first and second source terminals $S_{source\_a}$, $S_{source\_b}$ of the pair of input transistors (302), which affects, regarding their values, the first and second output signals $S_{cmp\_a}$, $S_{cmp\_b}$ of the input stage (201) proportional to the first and second output current signals $S_{curr\_a}$, $S_{curr\_b}$, regarding their values, respectively.

Figure 6:
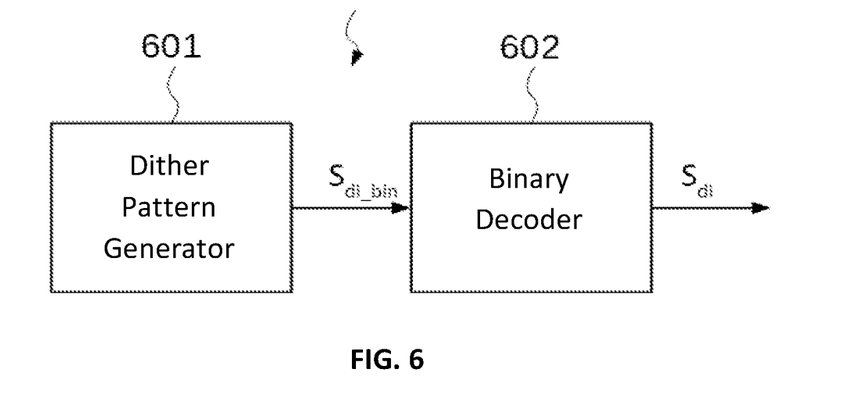
FIG. 6 is an example block diagram of a digital dither generator of the sigma-delta modulator based ADC according to the invention.

FIG. 6 illustrates an example block diagram of the digital dither generator (101) according to this invention. The digital dither generator (101) comprises a dither pattern generator (601) and a binary decoder (602) which are coupled together. The binary decoder (602) is configured to receive, for example, a plurality of binary representation of a dither pattern $S_{di\_bin}$ from the dither pattern generator (601) and to output the plurality of digital dither signals $S_{di}$.

The dither pattern generator (601) generates the plurality of binary representation of a dither pattern $S_{di\_bin}$. The dither pattern generator (601) can comprise, for example, a pseudo-random pattern generator.

The plurality of binary representation of a dither pattern $S_{di\_bin}$ from the dither pattern generator (601) can have a set of preferable characteristics such as a uniform amplitude distribution, multi levels of amplitude representation, or a random pattern or combination of the mentioned.

The plurality of binary representation of a dither pattern $S_{di\_bin}$ is received by the binary decoder (602) which generates the plurality of digital dither signals $S_{di}$, received by the analog dither circuit (304).

Figure 7:
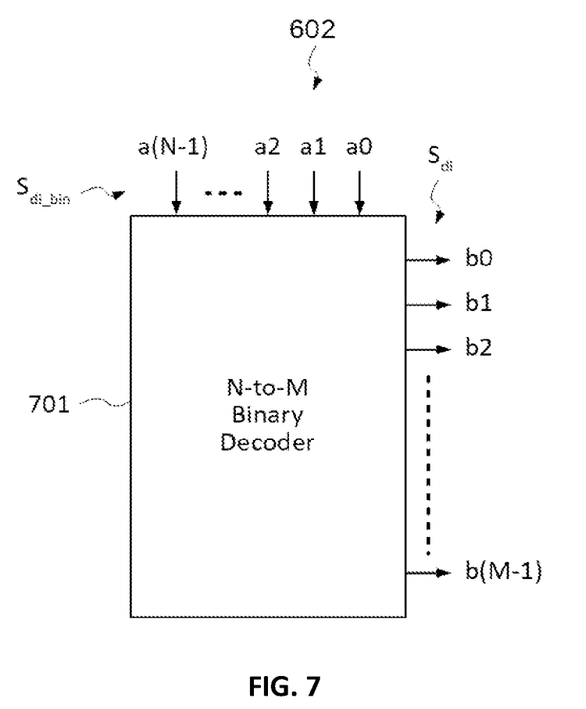
FIG. 7 is an example implementation of a binary decoder, N-to-M binary decoder, of the digital dither generator of the sigma-delta modulator based ADC according to the invention.

FIG. 7 illustrates example implementation of the binary decoder (602) of the digital dither generator (101) according to the invention. The binary decoder (602) mainly comprises a N-to-M binary decoder (701) for decoding the plurality of binary representation of a dither pattern $S_{di\_bin}$, which is as a plurality of binary coded inputs, a0 to a(N−1). The N-to-M binary decoder (701), then produces the plurality of digital dither signals $S_{di}$, which is as a plurality of decoded outputs, b0 to b(M−1). A number of decoded output bits (M) are correlated to a number of binary coded input bits (N) and can be calculated as M=2N. The state of the plurality of decoded outputs corresponds to the binary value of the plurality of binary coded inputs. The plurality of decoded outputs with the number of decoded output bits equal to M can be referred to as a M-bit decoded output. The plurality of binary coded inputs with the number of binary coded input bits equal to N can be referred to as a N-bit binary coded input.

As would be well known by the person skilled in the art, a suitable value for M is dictated by the required number of levels of amplitude of dithering, which depends on the requirement of the practical system.

Figure 8:
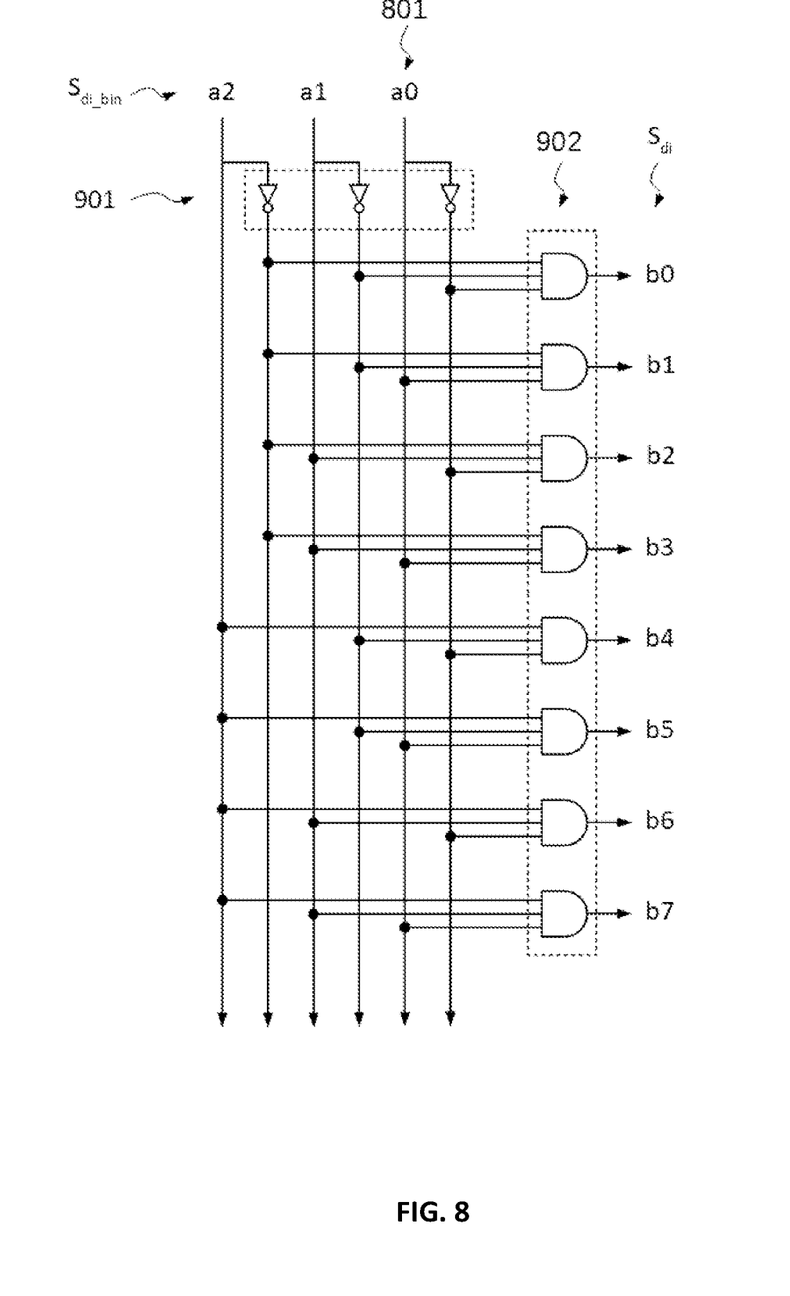
FIG. 8 is an example embodiment of the binary decoder as 3-to-8 binary decoder of the digital dither generator of the sigma-delta modulator based ADC according to the invention.

FIG. 8 illustrates an example embodiment of the binary decoder (602) according to this invention suitable for, but not limited to, the analog dither circuit (304) referred to FIG. 5. In this example, the binary decoder (602) comprises a 3-to-8 binary decoder (801) which receives a 3-bit binary coded input (also meaning three representations of a dither pattern of the plurality of representation of a dither pattern) and then produces an 8-bit decoded output (also meaning eight digital dither signals of the plurality of digital dither signals $S_{di}$). In a certain example of the 3-to-8 binary decoder (801), the 3-to-8 binary decoder (801) can include three NOT gates (901) and eight three-input AND gates (902), connected in a specific way, as shown in FIG. 8. The 8-bit decoded output, which is able to refer to in this example as the plurality of digital dither signals $S_{di}$, is coupled to the control terminals (405) of the plurality of transistors as switches (402), where one of the 8-bit decoded output is to be intentionally left unconnected because the number of transistors belonging to the plurality of transistors as switches (402) is seven while the number of decoded output bits is equal to eight.

As an example, referring to FIG. 5 and FIG. 8, some signals belonging to the plurality of decoded outputs, for example b1 to b7, are respectively coupled to the transistors, for example M0 to M6, belonging to the plurality of transistors as switches (402) where, in this example, b0 is to be intentionally left uncoupled. If, for example, the state of the inputs belonging to the plurality of binary coded inputs have the digital logic LOW at a0, the digital logic HIGH at a1 and the digital logic LOW at a2, only the decoded output b2, belonging to the plurality of decoded outputs, has the digital logic HIGH, which turns the transistor M1 belonging to the plurality of transistors as switches (402) on since the decoded output b2 is directly coupled with the transistor M1, belonging to the plurality of transistors as switches (402). While the decoded outputs b1, b3, b4, b5, b6 and b7, belonging to the plurality of decoded outputs have the digital logic LOW which turn the transistors M0, M2, M3, M4, M5 and M6 belonging to the plurality of transistors as switches (402) off.

Noted that for the plurality of decoded outputs which is as the plurality of digital dither signals $S_{di}$, only one of the plurality of the decoded outputs can be of logic HIGH at a given time. The decoded output (also called digital dither signal) of the plurality of decoded outputs which is of logic HIGH, controls only one transistor, coupled with the decoded output, in the plurality of transistors as switches (402) to turn on, while turning off for other transistors in the plurality of transistors as switches (402).

In a practical system, depending on the dithering requirement of the sigma-delta modulator based ADC (100), the number of bits generated from the digital dither generator (101) can be less for simplicity and relatively lower cost and for more uniform distribution of the plurality of digital dither signals $S_{di}$. The number of the binary coded input bits must be the same as the number of bits generated from the dither pattern generator (601). The number transistors, belonging to the plurality of transistors as switches (402) in the analog dither circuit (304) must be the same as the number of the decoded output bits.

What is claimed is:

1. A sigma-delta modulator based analog-to-digital converter (ADC) (100), comprising:
    a digital dither generator (101) configured to provide a plurality of digital dither signals $S_{di}$ the digital dither generator (101) comprising a dither pattern generator (601) and a binary decoder (602);
    a sigma-delta modulator loop (102) configured to receive an input analog signal $S_{in}$ and the plurality of digital dither signals $S_{di}$, and to provide a quantizer output signal $S_q$; and
    a processor (103) configured to provide a digital representation of the input analog signal $S_{in}$;

where the sigma-delta modulator loop (102) comprising
        an integrator (104) configured to provide an integrator output signal $S_{int}$;
        a feedback digital to analog converter (DAC) (105) configured to receive the quantizer output signal $S_q$ and to produce a feedback signal $S_{fb}$; and
        a quantizer (106) configured to receive the integrator output signal $S_{int}$ and the plurality of digital dither signals $S_{di}$ and to output the quantizer output signal $S_q$,
    where the quantizer (106) comprising
        an input stage (201) configured to receive the integrator output signal $S_{int}$ and the plurality of digital dither signals $S_{di}$ and to provide an output signal $S_{cmp}$; and
        a gain stage (202) configured to receive the output signal $S_{cmp}$ and to output the quantizer output signal $S_q$;
    where the input stage (201) comprising
        a current source (301);
        a pair of input transistors (302) configured to produce first and second output current signals $S_{curr\_a}$, $S_{curr\_b}$ in relation to the integrator output signal $S_{int}$ and a threshold signal $S_{threshold}$;
        a load network (303) configured to convert the first and second output current signals $S_{curr\_a}$, $S_{curr\_b}$ into the output signals $S_{cmp\_a}$, $S_{cmp\_b}$ of the input stage (201); and
        an analog dither circuit (304)
        characterized in that
        the analog dither circuit (304), coupled in series between the current source (301) and the pair of input transistors (302) and configured to receive the plurality of digital dither signals $S_{di}$ and to divide a bias current from the current source (301) to each transistor of the pair of input transistors (302).

2. The sigma-delta modulator based analog-to-digital converter (ADC) of claim 1 wherein the analog dither circuit (304) comprises
    a plurality of resistors (401) coupled in series and configured to provide resistance; and
    a plurality of transistors as switches (402) configured to function as switches.

3. The sigma-delta modulator based analog-to-digital converter (ADC) of claim 2 wherein the plurality of resistors (401) provide resistance between a first source terminal $S_{source\_a}$ of the pair of input transistors (302) to an output $S_{current}$ of the current source (301) and a second source terminal $S_{source\_b}$ of the pair of input transistors (302) to the output $S_{current}$ of the current source (301).

4. The sigma-delta modulator based analog-to-digital converter (ADC) of claim 2 or 3 wherein the plurality of resistors (401) providing resistance depending on current division ratio of the divided current.

5. The sigma-delta modulator based analog-to-digital converter (ADC) of claim 2 wherein the transistors of the plurality of transistors as switches (402) are coupled with terminals of resistors of the plurality of resistors (401) at drain terminals.

6. The sigma-delta modulator based analog-to-digital converter (ADC) of claim 2 wherein the plurality of transistors as switches (402) are coupled with the plurality of digital dither signals $S_{di}$ at control terminals (405).

7. The sigma-delta modulator based analog-to-digital converter (ADC) of claim 2 wherein the plurality of transistors as switches (402) are coupled with the output $S_{current}$ of the current source (301) at source terminals (406).

8. The sigma-delta modulator based analog-to-digital converter (ADC) of claim 2 wherein each transistor of the plurality of transistors as switches (402) is configured to provide a current path from the output $S_{current}$ of the current source (301) to one of the terminals of the plurality of resistors (401) when one of the transistors of the plurality of transistors as switches (402) is turned on.

9. The sigma-delta modulator based analog-to-digital converter (ADC) of claim 2 or 8 wherein the transistor of the plurality of transistors as switches (402) providing the current path is controlled by the plurality of digital dither signals $S_{di}$.

10. The sigma-delta modulator based analog-to-digital converter (ADC) of claim 2 or 8 wherein each transistor of the plurality of transistors as switches (402) is configured to receive each signal of the plurality of digital dither signals $S_{di}$.

11. The sigma-delta modulator based analog-to-digital converter (ADC) of claim 2 wherein left and right terminals of the plurality of resistors (403, 404) are coupled to the first and second source terminals $S_{source\_a}$, $S_{source\_b}$ respectively of the pair of input transistors (302).

12. The sigma-delta modulator based analog-to-digital converter (ADC) of claim 2 wherein a number of the plurality of transistors as switches (402) are the same as a number of the plurality of digital dither signals $S_{di}$; and
a number of the plurality of resistors (401) are at least one more than the number of the plurality of transistors as switches (402).

13. The sigma-delta modulator based analog-to-digital converter (ADC) of claim 2 wherein the plurality of resistors (401) can be replaced by a plurality of transistors, configured to function as resistors, biased in linear region.

14. The sigma-delta modulator based analog-to-digital converter (ADC) of claim 2 wherein all resistors in the plurality of resistors (401) can be of the same predetermined values.

15. The sigma-delta modulator based analog-to-digital converter (ADC) of claim 2 wherein each transistor of the plurality of transistors as switches (402) is only coupled with one digital dither signal from the plurality of digital dither signals $S_{di}$.

16. The sigma-delta modulator based analog-to-digital converter (ADC) of claim 1 wherein the plurality of digital dither signals $S_{di}$ is generated from the binary decoder (602) and then received by the analog dither circuit (304).

17. The sigma-delta modulator based analog-to-digital converter (ADC) of claim 16 wherein the binary decoder (602) is N-to-M binary decoder (701) configured to decode a plurality of binary representation of a dither pattern $S_{di\_bin}$ and produce the plurality of digital dither signal $S_{di}$,
wherein a number of decoded output bits (M) are correlated to a number of a binary coded input (N), calculated as M=2.

18. The sigma-delta modulator based analog-to-digital converter (ADC) of claim 1 wherein the analog dither circuit (304), coupled in series between the first and second source terminals $S_{source\_a}$, $S_{source\_b}$ of the pair of input transistors (302) and to the output $S_{current}$ of the current source (301).

19. The sigma-delta modulator based analog-to-digital converter (ADC) of claim 1 wherein the current division ratio of the divided current depends on the plurality of digital dither signals $S_{di}$.

20. The sigma-delta modulator based analog-to-digital converter (ADC) of claim 1 or 19 wherein the plurality of digital dither signals $S_{di}$ control the current division ratio by controlling which transistor belonging to the plurality of transistors as switches (402) to turn on.

21. The sigma-delta modulator based analog-to-digital converter (ADC) of claim 1 or 19 wherein the current division ratio from the first and second source terminals $S_{source\_a}$, $S_{source\_b}$ of the pair of input transistors (302) affects the first and second output current signals $S_{curr\_a}$, $S_{curr\_b}$.

22. The sigma-delta modulator based analog-to-digital converter (ADC) of claim 1 wherein the first and second output current signals $S_{curr\_a}$, $S_{curr\_b}$ affects, in proportional values, the first and second output signals $S_{cmp\_a}$, $S_{cmp\_b}$ of the input stage (201).

23. The sigma-delta modulator based analog-to-digital converter (ADC) of claim 1 wherein only one digital dither signal from the plurality of digital dither signals $S_{di}$ can be of logic HIGH at a given time.

24. The sigma-delta modulator based analog-to-digital converter (ADC) of claim 1 or 23 wherein only one digital dither signal from the plurality of digital dither signals $S_{di}$ to be logic HIGH can control a transistor in the plurality of transistors as switches (402) to turn on.

25. A dithering method of sigma-delta based modulator analog-to-digital converter (ADC), comprising:
receiving an input analog signal $S_{in}$ and a feedback signal Se at an integrator (104) to provide an integrator output signal $S_{int}$;
receiving the integrator output signal $S_{int}$ and a plurality of digital dither signal $S_{di}$ at an input stage (201) of a quantizer (106) and comparing the integrator output signal $S_{int}$ and the plurality of digital dither signal $S_{di}$ against a threshold signal $S_{threshold}$ to produce an output signal $S_{cmp}$ of the input stage (201);
amplifying the output signal $S_{cmp}$ of the input stage (201) at a gain stage (202) to produce a quantizer output signal $S_q$;
receiving the quantizer output signal $S_q$ at a processor (103) to produce a plurality of output digital signals $S_{out}$ as a digital representation of the input analog signal $S_{in}$;
characterized in that
receiving the plurality of digital dither signals $S_{di}$ at control terminals (405) of a plurality of transistors as switches (402) to control the plurality of transistors as switches (402) as turning on or off;
providing current from a current source (301) to first and second source terminals $S_{source\_a}$, $S_{source\_b}$ of a pair of input transistors (302) through the plurality of transistors as switches (402) and a plurality of resistors (401) respectively;
receiving the integrator output signal $S_{int}$ and the threshold signal $S_{threshold}$ at control terminals (305) of the pair of input transistors (302);
producing first and second output current signals $S_{curr\_a}$, $S_{curr\_b}$ in relation to the integrator output signal $S_{int}$ and the threshold signal $S_{threshold}$; and
converting the first and second output current signals $S_{curr\_a}$, $S_{curr\_b}$ at a load network (303) to the output signals $S_{cmp\_a}$, $S_{cmp\_b}$ of the input stage (201).

26. The dithering method of sigma-delta based modulator analog-to-digital converter (ADC) of claim 25, further comprising generating the plurality of digital dither signals $S_{di}$ at a binary decoder (602) of a digital dither generator (101).

27. The dithering method of sigma-delta based modulator analog-to-digital converter (ADC) of claim 26 wherein generating the plurality of digital dither signals $S_{di}$ includes generating logic HIGH and LOW of the plurality of digital dither signals $S_{di}$; and propagating the logic HIGH and LOW of the plurality of digital dither signals $S_{di}$ wherein controlling the plurality of transistors as switches (402) to turn on or off.

28. The dithering method of sigma-delta based modulator analog-to-digital converter (ADC) of claim 27 wherein controlling the plurality of transistors as switches (402) to turn on if logic HIGH and controlling the plurality of transistors as switches (402) to turn off if logic LOW.

29. The dithering method of sigma-delta based modulator analog-to-digital converter (ADC) of claim 25, further comprising providing current path by one of transistors of the plurality of transistors as switches (402) turned on, from an output $S_{current}$ of the current source (301) to one of terminals of the plurality of resistors (401).

30. The dithering method of sigma-delta based modulator analog-to-digital converter (ADC) of claim 25, further comprising dividing current between the first and second source terminals $S_{source\_a}$, $S_{source\_b}$ of the pair of input transistors (302) according to the current division ratio of the divided current wherein controlled by transistor of the plurality of transistors as switches (402) which is turned on.

* * * * *